US011056700B2

(12) United States Patent
Fuchs et al.

(10) Patent No.: US 11,056,700 B2
(45) Date of Patent: Jul. 6, 2021

(54) CIRCUIT ARRANGEMENT FOR IMPRESSING AN ELECTRICAL SIGNAL INTO AN ELECTROCHEMICAL ENERGY SUPPLY DEVICE

(71) Applicant: AVL List GmbH, Graz (AT)

(72) Inventors: Ernst Fuchs, Kumberg (AT);
Klaus-Christoph Harms, Thal/Graz (AT); Josef Reiterer, Wettmannstätten (AT)

(73) Assignee: AVL List GmbH, Graz (AT)

( * ) Notice: Subject to any disclaimer, the term of this patent is extended or adjusted under 35 U.S.C. 154(b) by 221 days.

(21) Appl. No.: 16/063,306

(22) PCT Filed: Dec. 15, 2016

(86) PCT No.: PCT/EP2016/081210
§ 371 (c)(1),
(2) Date: Jun. 18, 2018

(87) PCT Pub. No.: WO2017/102956
PCT Pub. Date: Jun. 22, 2017

(65) Prior Publication Data
US 2018/0375134 A1 Dec. 27, 2018

(30) Foreign Application Priority Data

Dec. 17, 2015 (AT) .................................. A 797/2015

(51) Int. Cl.
*H01M 8/04992* (2016.01)
*H01M 8/04537* (2016.01)
(Continued)

(52) U.S. Cl.
CPC ...... *H01M 8/04992* (2013.01); *G01R 31/382* (2019.01); *H01M 8/00* (2013.01);
(Continued)

(58) Field of Classification Search
CPC ......... H01M 8/04992; H01M 8/04589; H01M 8/04559; H01M 8/04597; H01M 8/04537;
(Continued)

(56) References Cited

U.S. PATENT DOCUMENTS 5,396,165 A * 3/1995 Hwang .................... G05F 1/70
323/210
5,642,267 A * 6/1997 Brkovic .................. G05F 1/613
323/224
(Continued)

FOREIGN PATENT DOCUMENTS

CN 203786207 8/2014
DE 10036572 2/2002
(Continued)

OTHER PUBLICATIONS

Internationaler Recherchenbericht und Schriftlicher Bescheid [International Seach Report and the Written Opinion] dated Mar. 2, 2017 From the International Searching Authority Re. Application No. PCT/EP2016/081210 and Its Translation Into English. (20 Pages).

*Primary Examiner* — Richard Isla
*Assistant Examiner* — Dung V Bui

(57) ABSTRACT

The invention relates to a method for impressing an electrical alternating signal in an electrochemical energy supply device (1) by means of a control device (2), in which method a coupling capacitor ($C_k$) is connected in series between the control device (2) and the energy supply device (1) during the duration of the signal impression operation comprising the following steps which are executed by the control device (2):

Figure 1:
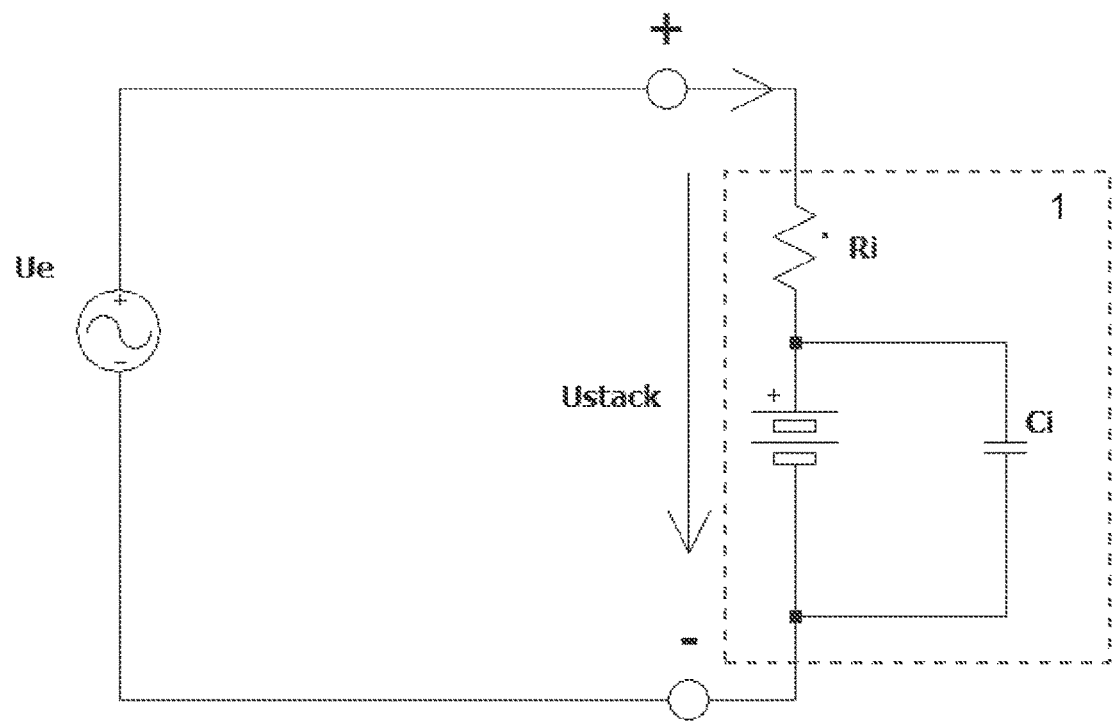

a) outputting an output signal ($S_{out}$) corresponding to the alternating signal to be impressed, for impression into the energy supply device (1), wherein the output signal ($S_{out}$) is determined based on at least one setpoint ($S_{set}$), which is set by the control device (2), of the alternating signal to be impressed;

(Continued)

b) detecting an actual signal ($S_{act}$) which corresponds to the output signal and which is applied to the energy supply device,
c) comparing the actual signal ($S_{act}$) with the setpoint ($S_{set}$) of the alternating signal to be impressed and
d) controlling the output signal ($S_{out}$) in order to minimize the deviation between the actual signal ($S_{act}$) and the setpoint ($S_{set}$) of the alternating signal to be impressed.

18 Claims, 3 Drawing Sheets

(51) Int. Cl.
| | | |
|---|---|---|
| *G01R 31/36* | (2020.01) | |
| *H01M 8/00* | (2016.01) | |
| *H01M 10/00* | (2006.01) | |
| *G01R 31/382* | (2019.01) | |
| *H03F 3/217* | (2006.01) | |

(52) U.S. Cl.
CPC ... *H01M 8/04559* (2013.01); *H01M 8/04589* (2013.01); *H01M 10/00* (2013.01); *H01M 8/04597* (2013.01); *H03F 3/217* (2013.01)

(58) Field of Classification Search
CPC ......... H01M 8/00; H01M 10/00; H03F 3/217; G01R 31/36; G01R 31/3606; G01R 31/382
USPC .......................................................... 320/166
See application file for complete search history.

(56) References Cited

U.S. PATENT DOCUMENTS

| | | | | | |
|---|---|---|---|---|---|
| 5,880,581 | A * | 3/1999 | Yang | .......................... | G05F 1/44 323/288 |
| 6,091,229 | A * | 7/2000 | Oglesbee | ................ | H02J 7/022 320/137 |
| 6,118,676 | A * | 9/2000 | Divan | ................... | H02J 3/1814 323/207 |
| 6,462,962 | B1 * | 10/2002 | Cuk | ......................... | H02M 1/34 363/131 |
| 8,872,594 | B2 * | 10/2014 | Sabut | .................... | H02M 3/156 332/109 |
| 2006/0071697 | A1 * | 4/2006 | Mels | ........................ | H03K 7/08 327/175 |
| 2006/0078788 | A1 | 4/2006 | Ramschak | | |
| 2008/0158915 | A1 * | 7/2008 | Williams | ................ | H02M 3/07 363/21.06 |
| 2009/0251934 | A1 * | 10/2009 | Shteynberg | ........... | H02M 3/155 363/81 |
| 2011/0227540 | A1 * | 9/2011 | Kanoh | .................... | B60L 53/00 320/135 |
| 2012/0135327 | A1 | 5/2012 | Jeong et al. | | |
| 2012/0150372 | A1 * | 6/2012 | Chiang | ................... | B60L 50/40 701/22 |
| 2012/0286691 | A1 * | 11/2012 | Jesme | ....................... | G06F 1/26 315/250 |
| 2013/0308358 | A1 * | 11/2013 | Usami | ..................... | H02M 7/04 363/84 |
| 2014/0070784 | A1 * | 3/2014 | Lynch | ................... | H02M 3/156 323/283 |
| 2014/0132063 | A1 * | 5/2014 | Kakiuchi | .................. | H02J 1/08 307/9.1 |
| 2014/0176144 | A1 | 6/2014 | Park et al. | | |
| 2014/0265908 | A1 * | 9/2014 | Su | .......................... | H05B 45/37 315/224 |
| 2015/0109839 | A1 * | 4/2015 | Usami | ..................... | H02M 1/12 363/127 |
| 2015/0155741 | A1 * | 6/2015 | Li | ........................... | G06F 1/206 320/101 |
| 2015/0180057 | A1 | 6/2015 | Park et al. | | |

FOREIGN PATENT DOCUMENTS

| | | |
|---|---|---|
| JP | 63-157080 | 6/1988 |
| JP | 09-133741 | 5/1997 |

* cited by examiner

CIRCUIT ARRANGEMENT FOR IMPRESSING AN ELECTRICAL SIGNAL INTO AN ELECTROCHEMICAL ENERGY SUPPLY DEVICE

RELATED APPLICATIONS

This application is a National Phase of PCT Patent Application No. PCT/EP2016/081210 having International filing date of Dec. 15, 2016, which claims the benefit of priority of Austrian Patent Application No. A 797/2015 filed on Dec. 17, 2015. The contents of the above applications are all incorporated by reference as if fully set forth herein in their entirety.

FIELD AND BACKGROUND OF THE INVENTION

The invention relates to a method for impressing an electrical alternating signal in an electrochemical energy supply device by means of a control device in which method a coupling capacitor is connected in series between the control device and the energy supply device during the duration of the signal impression.

Furthermore, the invention relates to a circuit arrangement with which the method according to the invention can advantageously be realized technically. It is a circuit arrangement for impressing an electrical alternating signal in an electrochemical energy supply device by means of a control device, comprising the control device for outputting an output signal corresponding to the alternating signal to be impressed, for impression into the energy supply device, wherein the output signal is determined based on at least one setpoint, which is set by the control device, of the alternating signal to be impressed. The circuit arrangement further comprises at least one coupling capacitor, being downstream of the control device, and being connected in series to the energy supply device at least during the duration of the signal impression. In addition, the invention relates to an energy conversion system comprising an electrochemical energy supply device and a circuit arrangement according to the invention. The term "electrochemical energy supply device" in the following relates to electrochemical energy storage and energy conversion devices that have an electrical residual stress and the ability to supply a load current. The current-voltage characteristic of such energy converters is often at least partially non-linear.

The impression of signals into electrochemical energy supply devices may be necessary, for example, in the application of methods in which the operating state of the electrochemical energy supply device is to be deduced by measuring voltage and/or current signal responses.

Such a method has become known, for example, from the document EP 1 646 101 B1, in which, for example, a predefinable low-frequency current signal is impressed into a fuel cell stack and, by comparison with a response signal measured at the fuel cell stack, typically a voltage signal, in particular by comparison of the harmonic components of the two signals, the operating state of the individual cells of the fuel cell stack can be deduced. In fuel cell stacks, which typically have a non-linear current-voltage characteristic, the operating state of the fuel cell stack can be deduced by comparing the harmonic component of the impressed signal with the harmonic component of the response signal that is distorted due to the non-linear behavior of the fuel cell stack.

In EP 1 646 101 B1, an output signal in the form of a current signal i(t) (see FIG. 1 of EP 1 646 101 B1) is impressed in a fuel cell stack. Since, in the arrangement according to FIG. 6 of EP 1 646 101 B1, the transmission path between the signal source of the signal i(t) to be impressed and the fuel cell is largely free of nonlinearities, in EP 1 646 101 B1 the output signal i(t) can be related directly to the signal impressed into the fuel cell stack. The specification of the signal to be impressed can therefore be executed as a simple control according to EP 1 646 101 B1. A non-linearity of the transmission path, which the output signal covers to the fuel cell stack, cannot be compensated.

SUMMARY OF THE INVENTION

It is therefore an object of the invention to provide a method which overcomes the disadvantage mentioned above and ensures that the actual value of a signal to be impressed (actual signal) largely coincides with the setpoint of the signal to be impressed, namely independently of whether the transmission path has a non-linear transmission behavior.

This object is achieved by a method of the aforementioned manner, in which according to the invention the following steps are executed by the control device:
a) outputting an output signal corresponding to the alternating signal to be impressed, for impression into the energy supply device, wherein the output signal is determined based on at least one setpoint, which is set by the control device, of the alternating signal to be impressed,
b) detecting an actual signal which corresponds to the output signal and which is applied to the energy supply device,
c) comparing the actual signal with the setpoint of the alternating signal to be impressed and
d) controlling the output signal in order to minimize the deviation between the actual signal and the setpoint of the alternating signal to be impressed.

By means of the method according to the invention, it is possible to minimize deviations between the actual signal and the setpoint of the alternating signal to be impressed, even if the transmission path towards the energy supply device has non-linear behavior. The signal to be impressed is preferably an alternating signal with frequency components between 0.1 Hz and 20 kHz, in particular between 1 Hz and 2 kHz.

In particular, it may be provided that the setpoint of the alternating signal to be impressed into the energy supply device represents a current signal and the actual signal applied to the energy supply device represents the actual value of the impressed current signal. In this way, a predefinable current profile can be impressed into the energy supply device (also referred below as the "test object"). The control is configured as a current control. The specification of the current to be impressed in the form of the current signal or the provision of an associated control has the advantage that impedance changes of the energy supply device, in particular in the case of an electrical short of the energy supply device, do not lead to unacceptably high impressed currents.

Alternatively, it can be provided that the setpoint of the alternating signal to be impressed into the energy supply device represents a voltage signal and the actual signal applied to the energy supply device represents the actual value of the impressed voltage signal. In this way, a voltage control or a voltage impression is implemented.

In addition, it can be provided to combine the current control with the voltage control, that is to specify voltage and/or current signals or values. In this way, impedance, admittance or power control can be implemented.

In addition, it can be provided that the actual voltage of the coupling capacitor is compared with the actual voltage of the energy supply device for determining a voltage difference, wherein i) it is switched to an interrupted state when a predefinable first value is exceeded, in which the impression of the alternating signal to be impressed is interrupted and the coupling capacitor is connected in parallel to the energy supply device to reduce the voltage difference, wherein preferably during the duration of the parallel connection of the coupling capacitor, a resistor is connected in series to the coupling capacitor in order to limit the charging current in the coupling capacitor and ii) at a point i) subsequent falling below a predefinable second value, it is switched in a signal impression state, in which the capacitor is connected in series with the energy supply device and the signal impression is continued according to steps a) to d).

The measurement of the voltage difference between the coupling capacitor and the energy supply device and the result-dependent charge of the coupling capacitor according to point i) and the subsequent connection in series according to point ii) enables to detect voltage fluctuations that may, for example, occur during operation of the energy supply device, and to adjust the voltage level of the capacitor accordingly so that the signal impression can be continued in point ii). If the predefinable first value is not exceeded, the signal impression can be continued. If the first value is exceeded, the signal impression is interrupted and will not be resumed until after the second value has fallen below. The first value is usually slightly below the supply voltage of the signal impression and, for example for supply voltages in the amount of approximately 50 V, can be between 30 and 45 V, preferably ≤40V. The second value is smaller than the first value and is e.g. between 20% and 70% of the first value. For a first value of, for example, ≤40V, it may be ≤1.5V.

In order to avoid the occurrence of impermissibly high currents on the signal impression, it can be provided that the output signal is limited to a maximum current value, preferably to a maximum of 2 A.

In particular, it can be provided that the characteristic of the voltage at the energy supply device and the current is measured by the energy supply device and by comparing the harmonic components of voltage and current the operating state of the energy supply device is deduced.

A method in which the operating state of the energy supply device is deduced by comparing the harmonic components of voltage and current has become known, for example, from EP 1 646 101 B1 and described by the terms "harmonic analysis" and THDA ("total harmonic distortion analysis"). The harmonic analysis has proven to be a possibility to detect the operating state of electrochemical energy supply devices that have a non-linear voltage-current characteristic. However, the harmonic analysis for detecting the operating state of an electrochemical energy storage/transducer is only one exemplary application in which the impression of a low-distortion signal in an electrochemical energy supply device is desired.

The above object is achieved in a further aspect of the invention by a circuit arrangement of the above mentioned type, in which the control device according to the invention is configured as a controlled power amplifier, that is returned at least one actual signal corresponding to the output signal and applied to the energy supply device during the duration of the signal impression, wherein the controlled power amplifier is adapted to compare the actual signal applied to the energy supply device with the setpoint of the alternating signal to be impressed and to control the output signal to minimize the deviation between the actual signal and the setpoint of the signal to be impressed. The setpoint of the signal to be impressed can be predefined, for example, by a signal generator. The configuration of the control device as a controlled power amplifier allows a particularly low distortion signal impression.

Analogously to the method according to the invention, it can be provided that the setpoint of the alternating signal to be impressed into the energy supply device represents a current signal and the actual signal applied to the energy supply device represents the actual value of the impressed current signal. In this way, a current control is given.

Alternatively, it can be provided that the setpoint of the alternating signal to be impressed into the energy supply device represents a voltage signal and the actual signal applied to the energy supply device represents the actual value of the impressed voltage signal. In this way, a voltage control is given.

In addition, it can be provided that current and/or voltage signals are predefined. In this way, impedance, admittance or power control can be realized.

In addition, it can be provided that the controlled power amplifier has a signal output for supplying the electrical alternating signal into the energy supply device, wherein the circuit arrangement further comprises a switching device for switchably connecting the signal output of the controlled power amplifier to the energy supply device, wherein the switching device is configured to compare the actual voltage of the coupling capacitor with the actual voltage of the energy supply device for detecting a voltage difference, and i) to switch to an interrupted state when a predefinable first value is exceeded, in which the impression of the alternating signal to be impressed is interrupted and the coupling capacitor is connected in parallel to the energy supply device to reduce the voltage difference, wherein preferably during the duration of the parallel connection of the coupling capacitor, a resistor is connected in series to the coupling capacitor in order to limit the charging current in the coupling capacitor and ii) at a point i) subsequent falling below a predefinable second value, to switch in a signal impression state, in which the capacitor is connected in series with the energy supply device and the signal impression is continued.

The coupling capacitor is thereby connected in series, such that the voltages at the connection in series with the energy supply device subtract with sign-correct addition, so that the coupling of alternating signals can also occur with low voltage levels of the alternating signals. In a particularly favorable embodiment of this aspect it can be provided that at least one first switching element is arranged between the signal output and the coupling capacitor, wherein further, at least one second switching element for parallel connection of the coupling capacitor is provided with the energy supply device, which is preferably connected in series with the resistor for limiting the charging current, wherein the switching device is configured to close the first switching element depending on the detected voltage difference and to open the second switching element and vice versa. The resistor for limiting the charging current is configured as an ohmic resistor is upstream or downstream of the second switching element.

In particular, it can be provided that between the coupling capacitor and the signal output, an auxiliary capacitor is arranged, wherein the coupling capacitor and the auxiliary capacitor are configured as unipolar capacitors, preferably as electrolytic capacitors and are connected in series towards the energy supply device with an opposite polarity to each other. Further at least one diode as polarity reversal protection is respectively connected in parallel with the two capacitors, wherein the second switching element is connected to the coupling capacitor at a branch point arranged between the capacitors. In this way, it is possible to couple the signal to be impressed with a particularly compact coupling, in particular, since unipolar capacitors generally have significantly higher capacitance values than bipolar capacitors for given construction volumes. In order to prevent situations in which the capacitors have low voltage values (for example due to a low voltage of the energy supply device), the voltage at the capacitors changes sign and the capacitors are thermally destroyed, it is provided that the capacitors are protected against reverse polarity by the diodes connected in parallel, which may be configured in particular as Schottky diodes. The auxiliary capacitor is arranged between the signal output of the control device and the branch point, and the coupling capacitor is arranged between the branch point and the energy supply device, wherein the electric strength of the auxiliary capacitor is between $\frac{1}{20}$ and $\frac{1}{5}$, preferably between $\frac{1}{13}$ and $\frac{1}{8}$ of the electric strength of the coupling capacitor, wherein the electric strength of the auxiliary capacitor is in particular between 40 and 60 V and the electric strength of the coupling capacitor is in particular between 400 and 600 V. In principle, the auxiliary capacitor could also be omitted. However, it can be ensured by the auxiliary capacitor that even if the voltage of the test object is smaller than the supply voltage of the signal impression (e.g. 50 V), reversion of the polarity of the coupling capacitor occurs. In order to enable a uniform discharge of the auxiliary capacitor, preferably an ohmic resistor is connected in parallel thereto. For signal impression, the connection of the signal output to the energy supply device via the first switching element must be closed so that the alternating signal to be impressed can be transmitted via the connection in series of auxiliary capacitor and coupling capacitor towards the energy supply device. Modern electrochemical energy supply devices, such as those used to power electric vehicles, may have nominal operating voltages of 500 V and higher. The operating voltage may depend greatly on the operating state of the energy supply device (i.e. an energy storage or an energy transducer) and may well exhibit fluctuations of up to 50% of the nominal voltage or more.

In particular, it may be provided that the controlled power amplifier is configured as a class D power amplifier, which is preferably set up to output PWM-modulated signals to the signal output. The pulse width modulated signals have a signal level of, for example, a maximum of ±50 V at a switching frequency of, for example, 300 to 400 kHz. Such class D power amplifiers have a very high signal quality, which can ensure that the signal is impressed with a low harmonic distortion. The controlled power amplifier is preferably configured in a clocked half-bridge topology (class D amplifier) in order to execute the signal impression with low loss, cost and energy efficiency. The voltage supply of the signal impression is usually limited (to e.g.: ±25V to ±50V). As long as the voltage of the energy supply device is smaller than the supply voltage of the signal impression, theoretically also a signal impression is possible without addition of the coupling capacitor.

Preferably, it can be provided that the controlled power amplifier has, in particular a low-pass filter, particularly preferably a class D amplifier reconstruction filter, towards the signal output for smoothing the electrical alternating signal to be impressed via the signal output.

In a further aspect of the invention, the object mentioned above is achieved by an energy conversion system which has an electrochemical energy supply device and a circuit arrangement according to the invention for impressing an electrical alternating signal into the electrochemical energy supply device.

It can be provided that the electrochemical energy supply device is a fuel cell or a battery, in particular a NiMh- or a lithium-ion battery. The fuel cell may e.g. be operated as an electrolyzer. The term "fuel cell" is also understood both as an individual cell and a fuel cell stack, consisting of a connection in series of a plurality of individual cells. Similarly, a battery may also consist of a single cell or a serial and/or parallel circuit having multiple cells. The residual stress of the electrochemical energy supply device is typically a DC voltage.

BRIEF DESCRIPTION OF THE SEVERAL
VIEWS OF THE DRAWINGS

Figure 2:
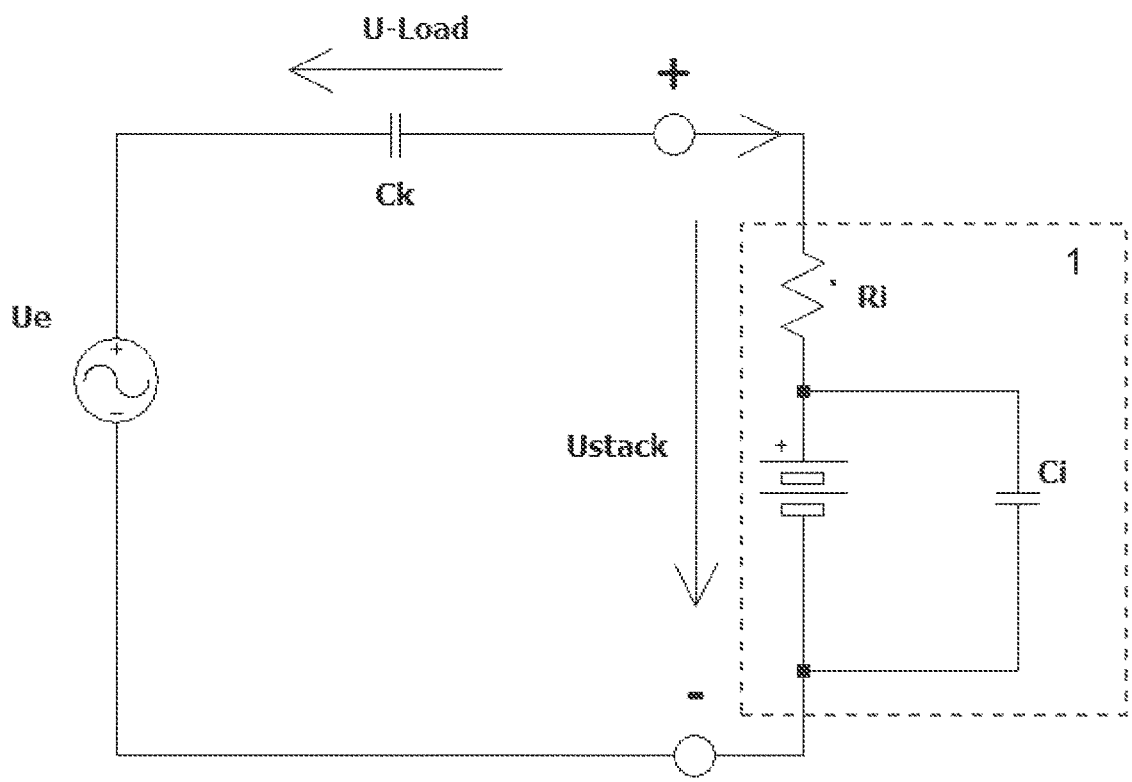
Figure 3:
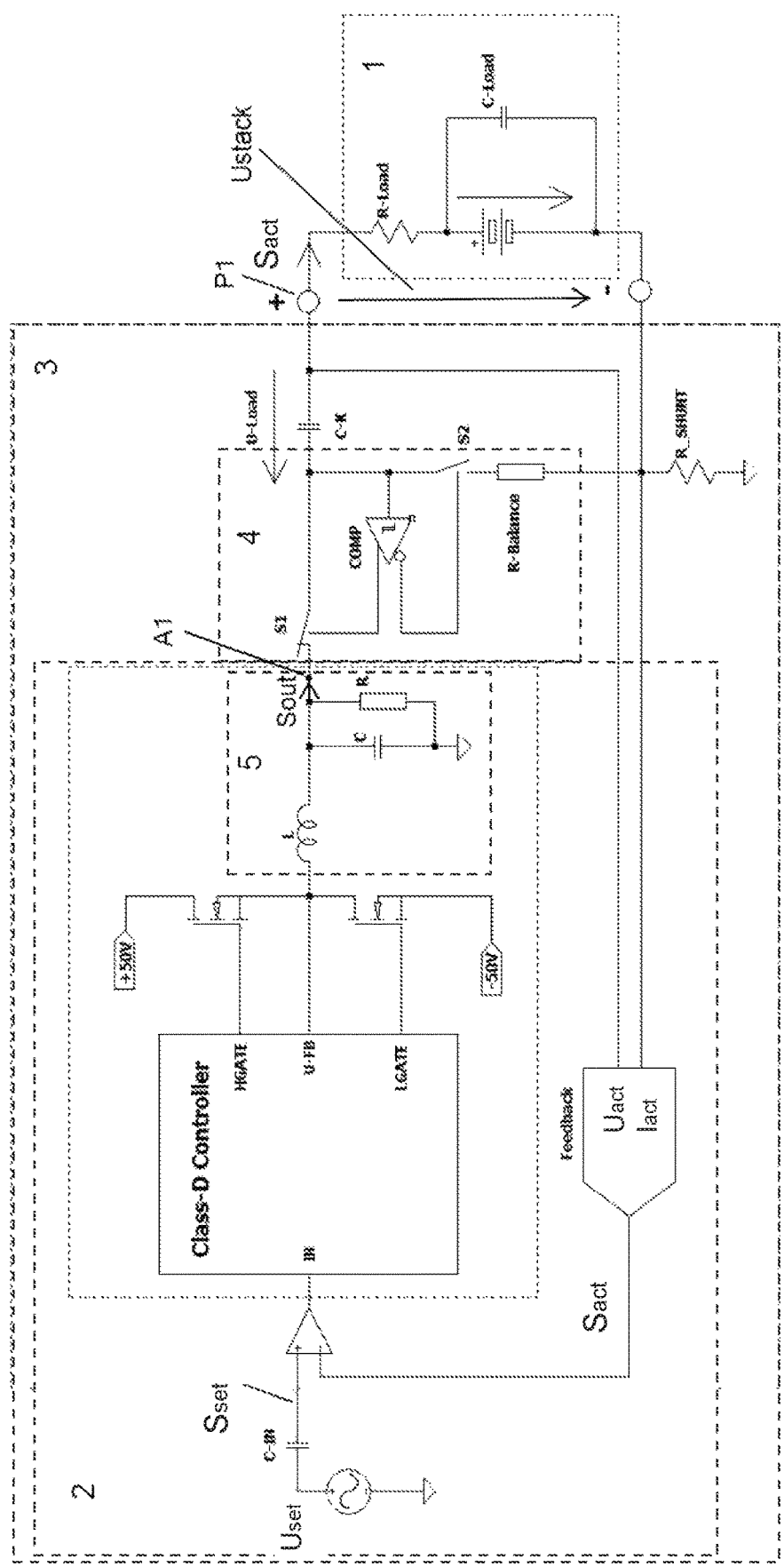
Figure 4:
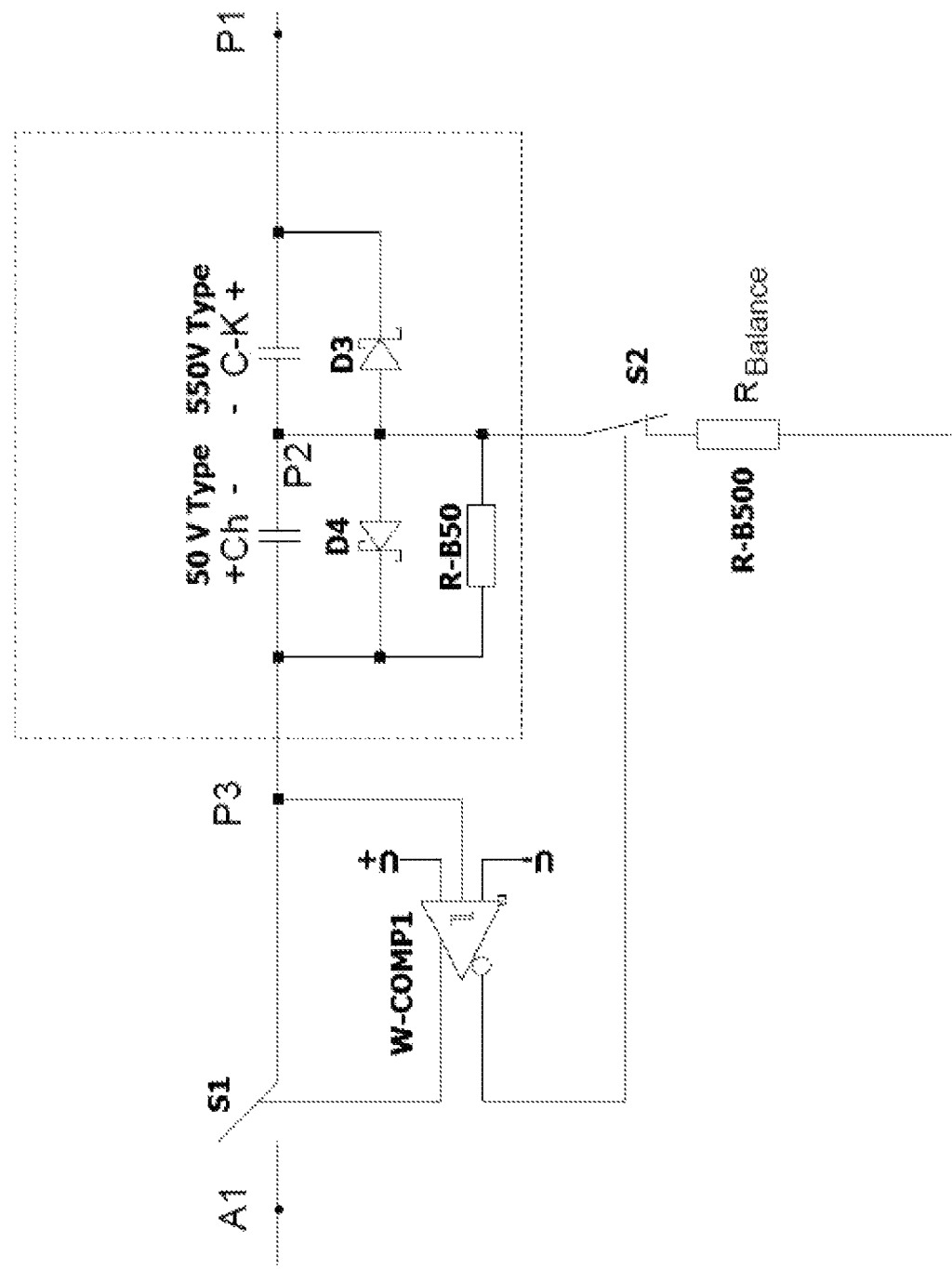

The invention is explained in more detail below based on an exemplary and non-restrictive embodiment, which is illustrated in FIGS. 3 and 4. In the Figures show:

FIG. 1 an electrical equivalent circuit diagram of an arrangement for supplying an electrical alternating signal into an energy supply according to the prior art, FIG. 2 a development of the electrical equivalent circuit diagram of FIG. 1, FIG. 3 an electrical equivalent circuit diagram of an embodiment of the invention and FIG. 4 a detailed representation of a development of the embodiment of FIG. 3.

DESCRIPTION OF SPECIFIC EMBODIMENTS
OF THE INVENTION

In the following figures, unless otherwise indicated, equal reference signs designate equal features.

FIG. 1 shows an electrical equivalent circuit diagram of an arrangement for supplying an electrical alternating signal into an energy supply device according to the prior art. In the simplest case, a voltage source Ue is sufficient for this purpose, by means of which an alternating signal can be impressed into an electrochemical energy supply device 1. The energy supply device 1 typically has a capacitance Ci and an internal resistor Ri.

In known methods for testing and diagnosing an energy supply device 1 (e.g., EP 1 646 101 B1), the energy supply device 1 (hereinafter also referred to as a "test object") is applied (loaded) with a test signal and an associated response signal is measured and analyzed. Since the load signals (residual stress and load current) of the test object can usually be regarded as substantially constant over time ("DC"=direct current=DC signal), it is possible to distinguish and differentiate these from the periodic alternating signals ("AC"=alternating current) of the test and response signals.

In order to be able to impress an AC current of e.g. 2 A in an energy supply device 1 in an arrangement according to FIG. 1 with the DC-residual stress $U_{stack}$ of, for example, 500V and above and an internal resistor Ri of approximately 0.01 Ohm, it is necessary to generate an AC voltage of $Ue=I_{AC}*Ri$ (e.g. $2\ A*0.01\Omega=0.02\ V_{AC}$), which must be superimposed on the DC residual stress of 500 V. The generation of such test signals with a corresponding device of FIG. 1 is generally associated with a high equipment complexity and corresponding costs, since relatively expensive circuit components for higher voltages, currents and power are required, which also must be protected carefully against various incidents (overloads, load fluctuations, load shedding in case of emergency, etc., . . . ).

FIG. 2 shows a development of the electrical equivalent circuit diagram of FIG. 1, in which a coupling capacitor $C_k$ is provided. This arrangement corresponds in principle to the circuit which has become known from EP 1 646 101 B1. In said EP 1 646 101 B1 it is proposed to use a coupling capacitor $C_k$ for separating the AC signals from the DC signals, which is connected between the impressing circuit and the energy supply device 1. However, the coupling capacitor $C_k$, which must charge to the high DC stack voltage $U_{stack}$, must have a very large capacitance, e.g. 0.01 F, in order to also allow the impression of low-frequency alternating signals with reasonable voltage levels. For example, the supply voltage of the circuit arrangement for signal impression should be greater than 32 V in order to impress a test current of e.g. 2 A ($U=I*Xc=I*1/(\omega C)=2*1/(2*n*0.01)=32$ V) at a low frequency of e.g. 1 Hz. The test current to be impressed is predefined in the circuit according to EP 1 646 101 B1 by a simple control. In the case that the transmission path from the impression circuit towards the energy supply device has a non-linear behavior, the signal to be impressed is correspondingly influenced and falsified along the transmission path.

FIG. 3 shows an electrical equivalent circuit diagram of an embodiment of the invention, which, according to the invention, is able to compensate for a non-linear behavior of the transmission path and to minimize the deviation between an actual signal $S_{act}$ and the setpoint $S_{set}$ of an alternating signal to be impressed by controlling an output signal $S_{out}$. FIG. 3 shows a circuit arrangement 3 according to the invention for impressing an electrical alternating signal into an electrochemical energy supply device 1 by means of a control device 2. For this purpose, the circuit arrangement 3 has the control device 2 for outputting an output signal $S_{out}$ corresponding to the alternating signal to be impressed and at least one coupling capacitor $C_k$ downstream of the control device 2. The output signal $S_{out}$ is determined based on at least one setpoint $S_{set}$, which is set by the control device 2, (in the present example, the setpoint $S_{set}$ is predefined by the output signal $U_{set}$ of a signal generator) of the alternating signal to be impressed. The coupling capacitor $C_K$ is connected in series to the energy supply device 1 during the duration of the signal impression. The control device 2 is configured as a controlled power amplifier, to which at least one actual signal $S_{act}$ is returned during the duration of the signal impression, which corresponds to the output signal $S_{out}$ and which is applied at the energy supply device 1. The controlled power amplifier is set up to compare the actual signal $S_{act}$ applied to the energy supply device 1 with the setpoint $S_{set}$ of the alternating signal to be impressed and to control the output signal $S_{out}$ to minimize the deviation between the actual signal $S_{act}$ and the setpoint $S_{set}$ of the signal to be impressed.

In particular, the control device 2 or the power amplifier has a signal output A1 for supplying the electrical alternating signal into the energy supply device 1, wherein the circuit arrangement 3 further has a switching device 4 for switchably connecting the signal output A2 of the controlled power amplifier to the energy supply device 1, wherein the switching device 4 is set up to compare the actual voltage $U_{Load}$ of the coupling capacitor $C_k$ with the actual voltage $U_{stack}$ of the energy supply device 1 for detecting a voltage difference, and i) when a predefinable first value is exceeded, to switch to an interrupted state in which the impression of the alternating signal to be impressed is interrupted and the coupling capacitor $C_k$ is connected in parallel to the energy supply device 1, in order to reduce the voltage difference, wherein preferably during the duration of the parallel connection of the coupling capacitor $C_k$ a resistor $R_{Balance}$ is connected in series to the coupling capacitor $C_k$ in order to limit the charging current in the coupling capacitor $C_k$, and ii) at a point i) subsequent falling below a predefinable second value, to switch in a signal impression state, in which the coupling capacitor $C_k$ is connected in series to the energy supply device 1 in order to continue the signal impression.

For this purpose, in the present embodiment, at least one first switching element S1 is arranged between the signal output A1 and the coupling capacitor $C_k$. Furthermore, at least one second switching element S2 is provided for a parallel connection of the coupling capacitor $C_k$ with the energy supply device 1, wherein the switching device 4 is set up, to close the first switching element 1 depending on the detected voltage difference and to open the second switching element 2 and vice versa. The detection of the voltage difference and the control of the switching elements 1 and 2 can be executed, for example, via a comparator COMP, which may be configured as part of the switching device 4.

To smooth the output signal $S_{out}$, it is preferably provided that the controlled power amplifier has a reconstruction filter 5, in particular a low-pass filter, particularly preferred a class-D amplifier reconstruction filter, towards the signal output A1, through which the output signal $S_{out}$ is transferred to the signal output A1.

As already mentioned, in order to supply low-frequency signals (for example 1 Hz), a coupling capacitor $C_k$ with a large capacity is required in order to be able to impress currents of the order of 2 A in the energy supply device 1 at voltages in the range of 30 to 50 V. Large coupling capacitors for high operating voltages of e.g. 500 V are usually available as unipolar electrolytic capacitors. They generally show a sufficiently linear behavior, but may only be operated with the correct polarity: Thus the sign of the differential voltage at the coupling capacitor $C_k$ must always be the same. This operating condition is satisfied when the residual stress $U_{stack}$ of the electrochemical energy supply device 1 or the test object (for example 500 V) is always higher than the maximum voltage of the alternating signal to be impressed (for example at maximum 50 V).

But if the residual stress of the test object is relatively low, e.g. only 5 V, and the coupling capacitor with a size of 0.01 F must be controlled for generating the required high test currents (e.g. 2 A) at low test frequencies (e.g. 1 Hz) with a correspondingly high test voltage (e.g. 50 V), then the operating condition for an electrolytic capacitor as a coupling capacitor $C_k$ is not met. Subsequently, it would lead to the destruction of the capacitor, which would be associated with a significant safety risk (fire hazard, etc.). In order to comply with this application, a suitable circuit is proposed in a development of the invention according to FIG. 4, with which a coupling capacitor $C_k$ configured as a unipolar capacitor coupling capacitor $C_k$ can be protected.

FIG. 4 shows a detailed representation of said development of the embodiment according to FIG. 3. In this arrangement, an auxiliary capacitor $C_h$ is arranged between the coupling capacitor $C_k$ and the signal output A1, wherein the coupling capacitor $C_k$ and the auxiliary capacitor $C_h$ are configured as unipolar capacitors, preferably as electrolytic capacitors. The two capacitors $C_h$ and $C_k$ are connected in series towards the energy supply device 1 in opposite polarity to each other, wherein at least one diode, in the present case, the Schottky diodes D3 and D4, as polarity reversal protection is respectively connected in parallel with the two capacitors. The second switching element S2 is connected to the coupling capacitor $C_k$ at a branch point P2 arranged between the capacitors. In order to allow a slow discharge of the auxiliary capacitor $C_h$, a resistor R-B50 (with an electric strength of 50 V) having a resistor value of the order of, for example, 600 to 1000 ohms is connected in parallel with the auxiliary capacitor $C_h$. This resistor can be constantly connected in parallel with the auxiliary capacitor $C_h$ and discharges it, whereby the provision of a further switch can be omitted. Since the auxiliary capacitor $C_h$ is only exposed to a maximum of the supply voltage of the circuit arrangement 3 (e.g., 50 V), it may have a significantly lower electric strength (e.g., 50 V electric strength for the auxiliary capacitor and, e.g., 500 V electric strength for the coupling capacitor) compared to the coupling capacitor $C_h$. By providing an auxiliary capacitor $C_h$ with a lower electric strength, costs for space requirements of the circuit arrangement 3 can be reduced. For example, the resistor $R_{Balance}$ may have an electric strength of 500 V and a value of about 220-250 ohms in order to limit the charging current in the coupling capacitor $C_k$ to also at maximum 2 A at voltage jumps of 500 V.

The comparator COMP is preferably a window comparator W-COMP1, which is set up to monitor the voltage at point P3. The switching elements S1 and S2 can be controlled by the comparator COMP, so that it is switched to an interrupted state when a predefinable first value is exceeded, by opening the first switching element S1 and closing the second switching element S2, so that the coupling capacitor $C_k$ can be loaded by the test object until the voltage difference falls below a predefined second value, whereupon the second switching element 2 is opened and the first switching element 1 is closed and the signal impression can be continued. By this procedure, it can be ensured that the voltage of the coupling capacitor $C_k$ is tracked a variable test voltage.

It can be expected that the development shown in FIG. 4 shows a non-linear transmission behavior and causes distortion of the transmitted signals (waveform, harmonic distortion, harmonics). In particular, in an analysis of the harmonic component, harmonic distortion or THD (=total harmonic distortion) caused by the test object in the response signal, relative to the impressed test signal (according to e.g. EP 1 646 101 B1), it would of course be particularly disturbing if already the actual characteristic of the test signal has strong deviations from the desired characteristic of the test signal, for example, a high harmonic distortion. However, such a non-ideal behavior of the transmission path is rendered ineffective by the aforementioned control according to the invention, whereby deviations of the characteristic, harmonic distortion, harmonic component, etc. remain negligibly small and the response signal of the test object can be analyzed and evaluated diagnostically relative to the desired characteristic of the test signal.

As a power amplifier a cheap class D amplifier (switching amplifier) can be advantageously used, which in itself is used for audio applications and with whose output signals, the FET power switches and the generally required reconstruction filter (L, C, R) for blocking the relatively high switching frequency can be controlled. In this case and for generating the clock frequency (for example 300 kHz) for the switching of the power electronics, a further control circuit may optionally be used which, as usual, is configured as a self-excited oscillator and optionally works in combination with the control circuit for voltage control. In this case, the security measures already implemented in the amplifier module prove to be particularly advantageous for protecting the sensitive power electronics. In FIG. 3, the capacitor C-IN symbolizes an AC coupling, so that AC signals can be impressed by the signal generator.

The invention also relates to a method for impressing an electrical alternating signal into an electrochemical energy supply device 1 by means of a control device 2, in which a coupling capacitor $C_k$ is connected in series between the control device 2 and the energy supply device 1 during the duration of the signal impression, comprising the following steps executed by the control device 2:

a) outputting an output signal $S_{out}$ corresponding to the alternating signal to be impressed, for impression into the energy supply device 1, wherein the output signal $S_{out}$ is determined based on at least one setpoint $S_{set}$, which is set by the control device 2, of the alternating signal to be impressed, b) detecting an actual signal $S_{act}$ which corresponds to the output signal and which is applied to the energy supply device 1, c) comparing of the actual signal $S_{act}$ with the setpoint $S_{set}$ of the alternating signal to be impressed and d) controlling the output signal $S_{out}$ in order to minimize the deviation between the actual signal $S_{act}$ and the setpoint $S_{set}$ of the alternating signal to be impressed.

Another aspect of the invention relates to an energy conversion system, comprising an electrochemical energy supply device 1 and a circuit arrangement 3 according to the invention.

In view of this teaching, one skilled in the art will be able to arrive at other, not shown embodiments of the invention without inventive step. The invention is therefore not limited to the embodiment shown. Also, individual aspects of the invention or the embodiment can be used and combined with each other. Essential are the ideas underlying the invention, which can be performed by a person skilled in the art in a variety of ways with the knowledge of this description and still remain maintained as such.

What is claimed is:

1. A method for impressing an electrical alternating signal into an electrochemical energy supply device by means of a control device, in which a coupling capacitor is connected in series between the control device and the electrochemical energy supply device during a duration of the impressing of the electrical alternating signal, comprising the following steps which are executed by the control device:

a) outputting an output signal corresponding to the electrical alternating signal to be impressed, for impression into the electrochemical energy supply device, wherein the output signal is determined based on at least one setpoint, which is set by the control device, of the electrical alternating signal to be impressed, b) detecting an actual signal which corresponds to the output signal and which is applied to the electrochemical energy supply device, c) comparing the actual signal with the at least one setpoint of the electrical alternating signal to be impressed and d) controlling the output signal in order to minimize a deviation between the actual signal and the at least one setpoint of the electrical alternating signal to be impressed;

wherein an actual voltage of the coupling capacitor is compared with an actual voltage of the electrochemical energy supply device for determining a voltage difference, wherein i) the electrochemical energy supply is switched to an interrupted state when a predefinable first value is exceeded, in which the impression of the electrical alternating signal to be impressed is interrupted and the coupling capacitor is connected in parallel to the electrochemical energy supply device to reduce the voltage difference, wherein during a duration of parallel connection of the coupling capacitor, a resistor is connected in series to the coupling capacitor in order to limit a charging current in the coupling capacitor and ii) at a point i) subsequent falling below a predefinable second value, the electrochemical energy supply is switched in a signal impression state in which the coupling capacitor is connected in series with the electrochemical energy supply device and the impressing of the electrical alternating signal is continued according to steps a) to d).

2. The method according to claim 1, wherein the at least one setpoint of the electrical alternating signal to be impressed into the electrochemical energy supply device represents a current signal and the actual signal applied to the electrochemical energy supply device represents an actual value of the impressed current signal.

3. The method according to claim 1, wherein the at least one setpoint of the electrical alternating signal to be impressed into the electrochemical energy supply device represents a voltage signal and the actual signal applied to the electrochemical energy supply device represents an actual value of the impressed voltage signal.

4. The method according to claim 1, wherein during a duration of parallel connection of the coupling capacitor, a resistor is connected in series to the coupling capacitor in order to limit a charging current in the coupling capacitor.

5. The method according to claim 1, wherein the output signal is limited to a maximum current value, to a maximum of 2 A.

6. The method according to claim 1, wherein a characteristic of the voltage at the electrochemical energy supply device and of a current is measured by the electrochemical energy supply device and by comparing harmonic components of the voltage and the current an operating state of the electrochemical energy supply device is deduced.

7. The method according to claim 2, wherein the at least one setpoint of the electrical alternating signal to be impressed into the electrochemical energy supply device represents a voltage signal and the actual signal applied to the electrochemical energy supply device represents an actual value of the impressed voltage signal.

8. A circuit arrangement for impressing an electrical alternating signal into an electrochemical energy supply device by means of a control device, comprising the control device for outputting an output signal corresponding to the electrical alternating signal to be impressed, for impression into the electrochemical energy supply device, wherein the output signal is determined based on at least one setpoint, which is set by the control device, of the electrical alternating signal to be impressed, and at least one coupling capacitor, being downstream of the control device, and being connected in series to the electrochemical energy supply device at least during a duration of the impressing of the electrical alternating signal, wherein the control device is configured as a controlled power amplifier, to which an actual signal is returned during a duration of the impressing of the electrical alternating signal, which corresponds to the output signal and which is applied at the electrochemical energy supply device, wherein the controlled power amplifier is set up to compare the actual signal applied at the electrochemical energy supply device with the at least one setpoint of the electrical alternating signal to be impressed and to control the output signal to minimize a deviation between the actual signal and the at least one setpoint of the electrical alternating signal to be impressed;

wherein the controlled power amplifier has a signal output for supplying the electrical alternating signal into the electrochemical energy supply device, wherein the circuit arrangement further comprises a switching device for switchably connecting the signal output of the controlled power amplifier to the electrochemical energy supply device, wherein the switching device is configured to compare an actual voltage of the coupling capacitor with an actual voltage of the electrochemical energy supply device for detecting a voltage difference, and i) to switch to an interrupted state when a predefinable first value is exceeded, in which the impression of the electrical alternating signal to be impressed is interrupted and the at least one coupling capacitor is connected in parallel to the electrochemical energy supply device to reduce the voltage difference, and ii) at a point i) subsequent falling below a predefinable second value, to switch in a signal impression state, in which the at least one coupling capacitor is connected in series with the electrochemical energy supply device in order to continue the impression of the electrical alternating signal.

9. The circuit arrangement according to claim 8, wherein the at least one setpoint of the electrical alternating signal to be impressed into the electrochemical energy supply device represents a current signal and the actual signal applied to the electrochemical energy supply device represents an actual value of the impressed current signal.

10. The circuit arrangement according to claim 8, wherein the at least one setpoint of the electrical alternating signal to be impressed into the electrochemical energy supply device represents a voltage signal and the actual signal applied to the electrochemical energy supply device represents an actual value of the impressed voltage signal.

11. The circuit arrangement according to claim 8, wherein during a duration of parallel connection of the at least one coupling capacitor, a resistor is connected in series to the at least one coupling capacitor in order to limit a charging current in the at least one coupling capacitor.

12. The circuit arrangement according to claim 11, wherein at least one first switching element is arranged between the signal output and the at least one coupling capacitor, wherein further at least one second switching element for parallel connection of the at least one coupling capacitor is provided with the electrochemical energy supply device, which is connected in series with the resistor for limiting the charging current, wherein the switching device is configured to close the at least one first switching element depending on the detected voltage difference, and to open the at least one second switching element and vice versa.

13. The circuit arrangement according to claim 12, wherein an auxiliary capacitor is arranged between the at least one coupling capacitor and the signal output, wherein the at least one coupling capacitor and the auxiliary capacitor are configured as unipolar capacitors, as electrolytic capacitors, and are connected in series towards the electrochemical energy supply device with an opposite polarity to each other, wherein at least one diode as polarity reversal protection is respectively connected in parallel with the at least one coupling capacitor and the auxiliary capacitor, wherein the at least one second switching element is connected to the at least one coupling capacitor at a branch point arranged between the at least one coupling capacitory and the auxiliary capacitor.

14. The circuit arrangement according to claim 11, wherein the controlled power amplifier is configured as a class-D power amplifier, which is set up to output PWM-modulated signals to the signal output.

15. The circuit arrangement according to claim 14, wherein the controlled power amplifier has a reconstruction filter, in particular a low-pass filter, particularly a class D amplifier reconstruction filter, towards the signal output for smoothing the electrical alternating signal to be impressed via the signal output.

16. An energy conversion system comprising the electrochemical energy supply device and a circuit arrangement according to claim 8 for impressing the electrical alternating signal into the electrochemical energy supply device.

17. The energy conversion system according to claim 16, wherein the electrochemical energy supply device is a fuel cell or a battery, in particular a NiMh- or a lithium-ion battery.

18. The circuit arrangement according to claim 9, wherein the at least one setpoint of the alternating signal to be impressed into the electrochemical energy supply device represents a voltage signal and the actual signal applied to the electrochemical energy supply device represents an actual value of the impressed voltage signal.

* * * * *